(12) United States Patent
Okazaki

(10) Patent No.: US 6,975,344 B2
(45) Date of Patent: Dec. 13, 2005

(54) IMAGE RECORDER AND LIGHT SOURCE UNIT WITH FIXED ELEMENT

(75) Inventor: Masahide Okazaki, Kyoto (JP)

(73) Assignee: Dainippon Screen Mfg. Co., Ltd., Kyoto (JP)

( * ) Notice: Subject to any disclaimer, the term of this patent is extended or adjusted under 35 U.S.C. 154(b) by 0 days.

(21) Appl. No.: 10/245,742

(22) Filed: Sep. 18, 2002

(65) Prior Publication Data

US 2003/0052960 A1    Mar. 20, 2003

(30) Foreign Application Priority Data

Sep. 20, 2001    (JP)    .......................... P2001-286797

(51) Int. Cl.[7] .................................................. B41J 2/45
(52) U.S. Cl. ................................................... 347/238
(58) Field of Search ............................. 347/237–238, 347/241, 256, 130, 245, 242, 257, 263, 247; 257/100, 724; 372/36, 75; 385/88; 438/106–111, 438/129

(56) References Cited

U.S. PATENT DOCUMENTS

| | | | |
|---|---|---|---|
| 4,743,091 A | 5/1988 | Gelbart | 369/112.24 |
| 4,901,325 A | 2/1990 | Kato et al. | 372/40 |
| 4,928,122 A * | 5/1990 | Doi et al. | 347/241 |
| 5,557,116 A * | 9/1996 | Masui et al. | 257/100 |
| 5,617,441 A | 4/1997 | Nakata et al. | 372/70 |
| 5,872,803 A * | 2/1999 | Shih et al. | 372/75 |
| 6,034,712 A * | 3/2000 | Iwasaki | 347/241 |
| 6,146,025 A * | 11/2000 | Abbink et al. | 385/88 |
| 6,188,132 B1 * | 2/2001 | Shih et al. | 257/724 |
| 2002/0054615 A1 * | 5/2002 | Nagamatsu et al. | 372/36 |

FOREIGN PATENT DOCUMENTS

| | | | |
|---|---|---|---|
| JP | 5-113545 | 5/1993 | |
| JP | 5-129664 | 5/1993 | |
| JP | 11-208020 | * 8/1999 | ............. B41J 3/21 |

OTHER PUBLICATIONS

Mitsuhiro Yano, "Passive Alignment", pp. 3-11, vol. 34, No. 12, Extraction from "Optical Contact", Japan Optoelectro-Mechanics Association, published Dec. 20, 1996.

Mitsuo Usui et al., "Mounting Technique for Micro-Optics", pp. 20-24, vol 34, No. 12, Extraction from "Optical Contact", Japan Optoelectro-Mechanics Association, published Dec. 20, 1996.

(Continued)

*Primary Examiner*—Hai Pham
(74) *Attorney, Agent, or Firm*—McDermott Will & Emery LLP

(57) ABSTRACT

A light source unit is provided with light source parts, a fixable member and a positioning member. Each light source part comprises a submount receiving a bare chip of a laser diode thereon and a collimator lens collimating laser beam emitted from the bare chip of the laser diode for defining the emitting direction. The plurality of light source parts are directly fixed to the fixable member consisting of a member having excellent thermal conductivity for quickly transmitting generated heat to a cooling unit and radiating the same and having a wiring function for supplying current to the light source parts. The positioning member has lens holes on prescribed positions so that the collimator lenses of the light source parts are fit therein for positioning the light source parts. Thus, a light source unit, having a plurality of channels, improving the degree of integration and precision of laser diodes and an image recorder employing the same can be provided.

14 Claims, 8 Drawing Sheets

OTHER PUBLICATIONS

Kazuhiko Kurata, "SMT Optical Module and Hybrid Optical Integration", pp. 129-133, No. 4, Extraction from "OPTRONICS", OPTRONICS Corporation, published Jul. 10, 1999.

* cited by examiner

IMAGE RECORDER AND LIGHT SOURCE UNIT WITH FIXED ELEMENT

BACKGROUND OF THE INVENTION

1. Field of the Invention

The present invention relates to an integrated technique for a laser diode.

2. Description of the Background Art

In a raster scan exposure unit CTP or DDCP in the prepress and printing industry or a processless output unit (laser imager) for medical application employing a high-power laser diode having a plurality of channels, the number of channels is increased in order to further enhance the output speed.

When the number of channels is increased, however, light source parts are increased in cubic capacity to disadvantageously increase the cubic capacity of an optical system due to the large size of unit light sources forming the plurality of channels. Therefore, improvement is applied for increasing packaging density while enhancing the number of channels.

As a contrivance therefor, a method of separately placing large-sized light source parts and taking out beams emitted therefrom through an optical fiber member for bundling and concentrating the beams in the vicinity of an outlet of the optical fiber member or a method of arranging single-channel light source elements formed by combining can packaging laser diodes and collimator lenses with each other in a spatially crammed state has been employed in general.

In the method employing the optical fiber member, however, the light source parts themselves cannot be miniaturized although the beams can be bundled, and hence the size of the unit is disadvantageously increased as a result. Further, this method is inferior in stability of light output due to severe coupling accuracy between the light source parts and the optical fiber member.

In the method arranging the can packaging light source elements combined with collimator lenses, the size of each single-channel light source forming the minimum unit is relatively increased due to restriction by the size of the can. In order to arrange a large number of light sources, therefore, an optical system having an extremely large aperture is required and hence the size of the unit is so increased that not only the costs for the optical system and the unit are increased but also the optical path is increased to result in insufficient stability due to the optical system of a high reduction ratio.

SUMMARY OF THE INVENTION

The present invention is directed to an integrated technique for a laser diode.

According to the present invention, an image recorder for recording an image on a recording medium comprises a light source unit comprising a plurality of light source parts, each comprising a bare chip of a laser diode emitting laser beam, a submount holding the bare chip of the laser diode thereon, and a fixing part having at least one fixed element directly fixed to the submount of each one of the plurality of light source parts, whereby the light source unit emits a plurality of laser beams. The image recorder further comprises a scanning mechanism scanning the recording medium using the plurality of laser beams.

Therefore, structure of the light source unit can be simplified so that the light source unit can be scaled down and the degree of integration of the laser beams can be improved.

Preferably, the fixing part comprises a plurality of fixed elements, and the plurality of fixed elements are arranged in a three-dimensional layout.

Preferably, the plurality of light source parts emit laser beams having different wavelengths.

Preferably, the plurality of light source parts each comprise an optical element for collimating the laser beam emitted from the bare chip of the laser diode, and the light source unit further comprises a positioning element for defining arrangement of the plurality of light source parts on the basis of the optical element.

Further, the present invention is also directed to an image recorder.

Accordingly, a first object of the present invention is to provide a miniature light source unit also when provided with a large number of light sources while improving the degree of integration of optical elements.

A second object of the present invention is to provide a light source unit having a plurality of channels excellent in precision of direction and arrangement of beams emitted from light sources as well as heat radiation from the light sources and an image recorder utilizing such a light source unit.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 11 illustrates the configurational relation between a fixable member of a light source unit and light source parts according to a fifth preferred embodiment of the present invention; and FIG. 12 illustrates the appearance of each light source part in the fifth preferred embodiment of the present invention.

DESCRIPTION OF THE PREFERRED EMBODIMENTS

Preferred embodiments of the present invention are now described in detail with reference to the attached drawings.

Figure 1:
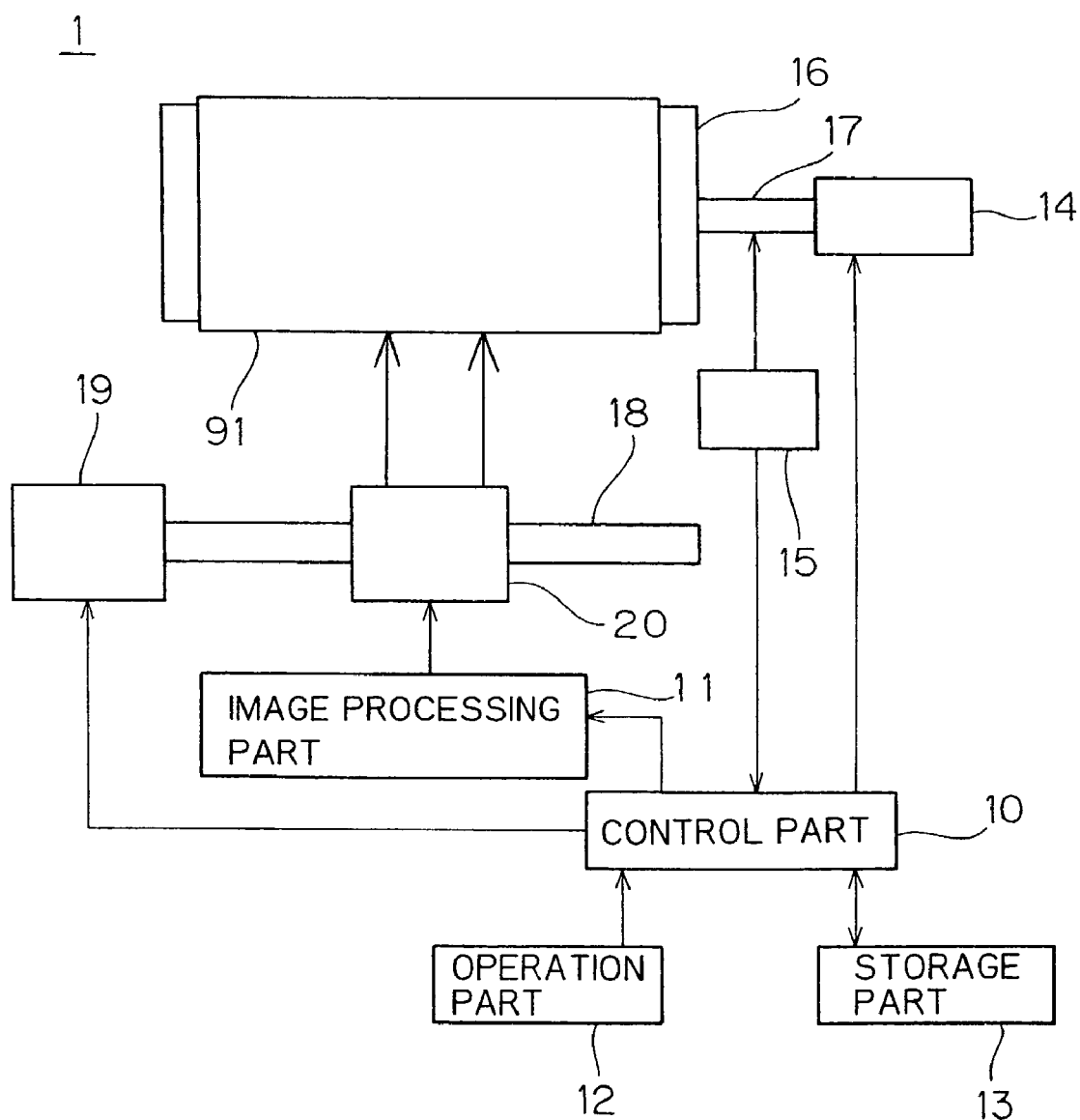
FIG. 1 illustrates the structure of an image recorder according to a first preferred embodiment of the present invention.

FIG. 1 illustrates the structure of an image recorder 1 according to the first preferred embodiment of the present invention. In the image recorder 1, a recording medium 91 is mounted on a rotating drum 16, and an optical recording head 20 emits laser beams for recording images on the recording medium 91.

A rotating motor 14 axially rotates a shaft 17 for rotating the rotating drum 16, thereby moving the recording medium 91 along a main scanning direction. A rotation sensor 15 detecting the quantity of rotation of the shaft 17 detects the movement in the main scanning direction and transmits the same to a control part 10 for controlling the rotating motor 14.

A scan motor 19 moves the optical recording head 20 along a head feeding mechanism 18. The optical recording head 20 receives data of the recording images from an image processing part 11 and emits laser beams for recording the images on the recording medium 91.

The control part 10 accepts input from an operator through an operation part 12 for performing control related to image recording on the basis of programs and data stored in a storage part 13.

Figure 2:
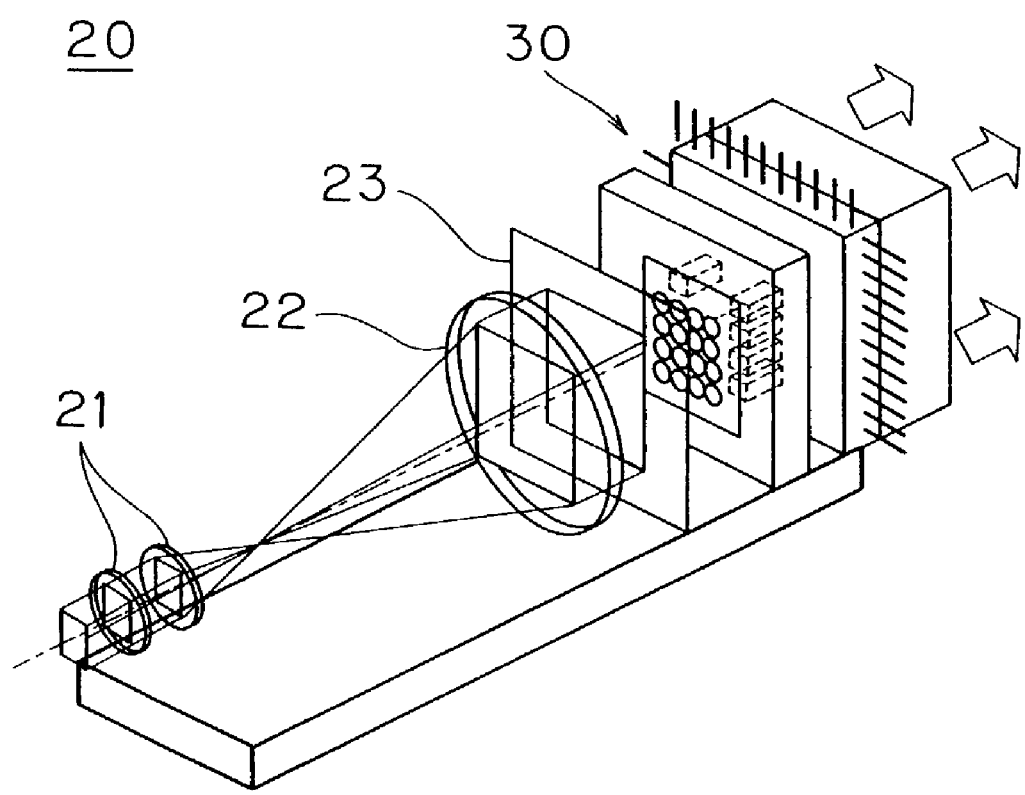
FIG. 2 illustrates the structure of an optical system of an optical recording head.

FIG. 2 illustrates an optical system of the optical recording head 20 in detail. The optical recording head 20 has the optical system formed by zoom lenses 21, a field lens 22, an aperture plate 23 and a light source unit 30.

In the optical recording head 20, the aperture plate 23 shapes and positions laser beams emitted from the light source unit 30, while the field lens 22 and the zoom lenses 21 form a telecentric optical system. Thus, exposure on the recording medium 91 is enabled in the so-called telecentric state, for enabling drawing in high accuracy.

Figure 3:
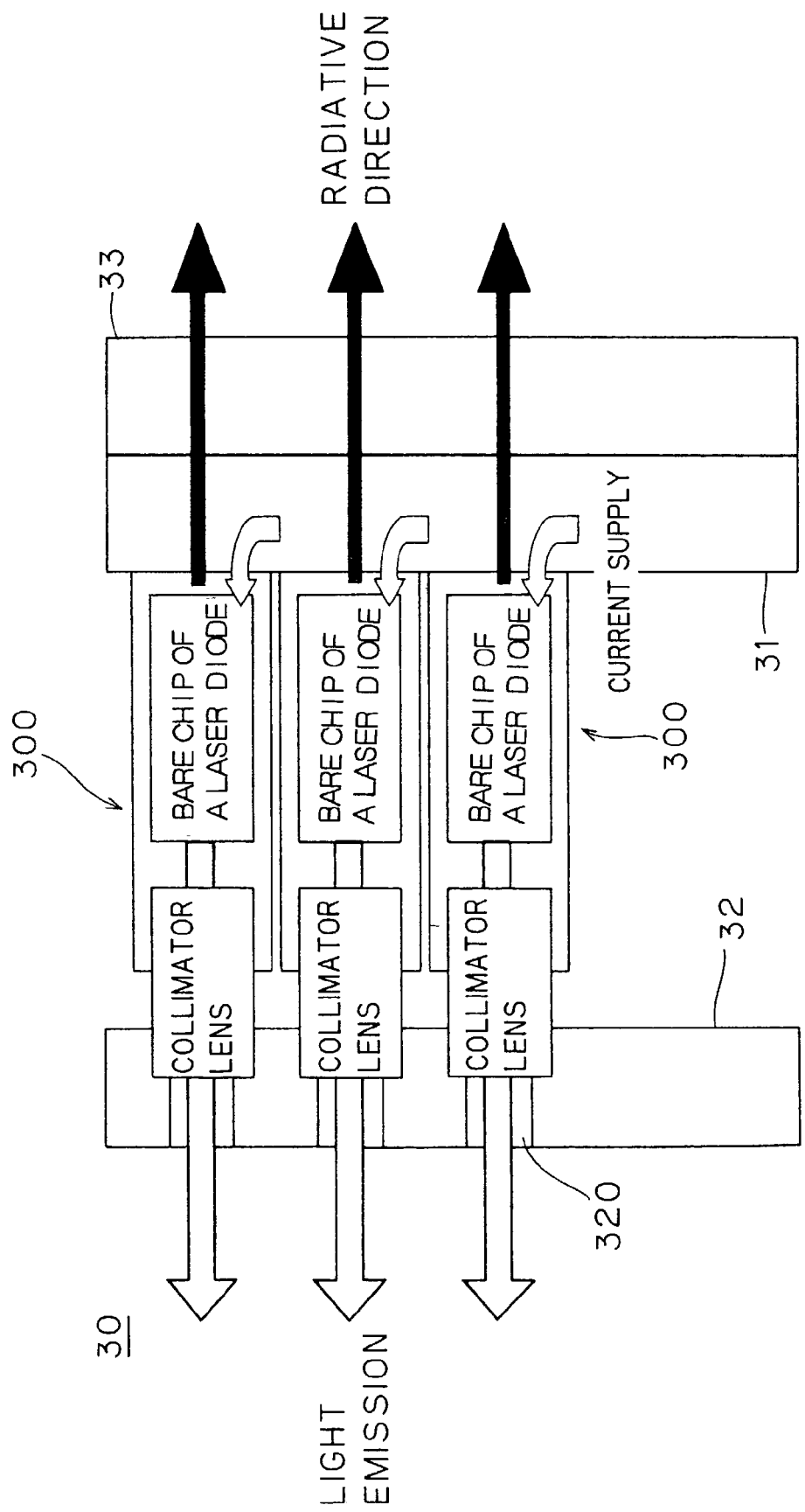
FIG. 3 illustrates the structure of a light source unit.

FIG. 3 illustrates the structure of the light source unit 30. The light source unit 30 is formed by a fixable member 31, light source parts 300, a positioning member 32 and a cooling unit 33. The positioning member 32 is provided with lens holes 320 on prescribed positions, for receiving collimator lenses 306 (see FIG. 4) of the light source parts 300 respectively.

Thus, the light source parts 300 can be mutually positioned with reference to the collimator lenses 306 serving as optical elements. This corresponds to positioning based on the emitting direction of the laser beams as described later, whereby the laser beams emitted from the light source unit 30 can be improved in positioning accuracy.

Figure 4:
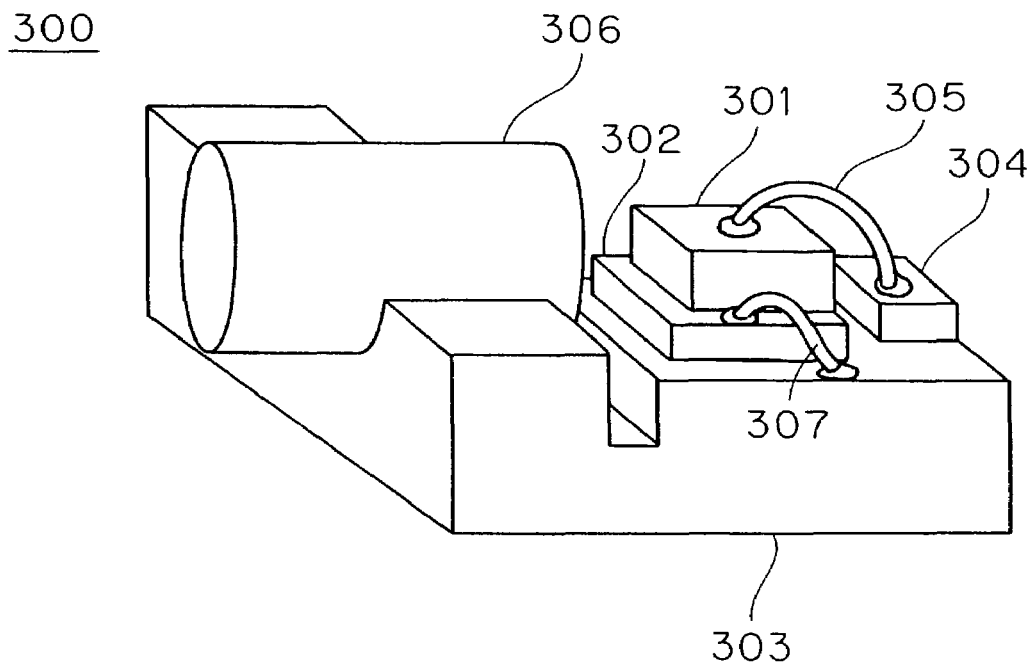
FIG. 4 illustrates the appearance of each light source part of the light source unit.

FIG. 4 illustrates the appearance of each light source part 300 of the light source unit 30. As shown in FIG. 4, the light source part 300 is formed by a bare chip 301 of a laser diode, a plurality of different submounts 302 and 303, a current supply terminal 304, a wire 305 and the collimator lens 306.

The bare chip 301 of the laser diode emits laser beams from the side surfaces (the right and left sides in FIG. 4) when current is supplied to the upper and lower surfaces serving as terminals. According to this preferred embodiment, the laser beam emitted from one of the side surfaces (the left side in FIG. 4) is utilized. The submount 302 (first block) is prepared from a material such as Si of SiC, for example, having a thermal expansion coefficient close to that of the bare chip 301, excellent thermal conductivity and excellent workability. The submount 302 is connected to the lower surface of the bare chip 301 and the upper surface of the submount 303 by a solder material such as In or PbSn.

Thus, the bare chip 301 is held on the submount 302, which in turn is held on the submount 303, and the light source part 300 is fixed to the fixable member 31 in a directly arranged state.

When the light source part 300 fails due to its trouble or the like, only the faulty light source part 300 can be readily replaced according to the structure employing the submounts 302 and 303, dissimilarly to a case of directly connecting the bare chip 301 to the fixable member 31. Further, the plurality of submounts 302 and 303 are so employed that the readily breakable bare chip 301 is temporarily fixed to the submount 302 before assembling the light source part 300, whereby the breakage rate in manufacturing steps can be reduced as compared with a case of directly handling the bare chip 301. In addition, the bare chip 301 can be accurately positioned due to the readily handleable structure, thereby improving alignment accuracy. According to this preferred embodiment, the submount 303 (second block) has the function of a terminal for supplying current to the bare chip 301. The submount 303, generally prepared from a nonconductive material, is plated with gold or the like on its surface and electrically connected to the submount 302 with a wire 307.

The current supply terminal 304 is connected to the submount 303 in an insulated state and further electrically connected to the upper surface of the bare chip 301 by the wire 305, for supplying current to the bare chip 301.

Thus, the submount 303 comprises a terminal for supplying driving current for the laser diode, whereby the structure of the light source part 300 can be simplified and the degree of integration of the laser beams in the light source unit 30 can be improved.

The collimator lens 306, having a function of collimating the laser beams emitted from the bare chip 301, is fixed to the submount 303 in prescribed positional relation to the bare chip 301 for defining the emitting direction of the laser beams to a prescribed direction.

Figure 5:
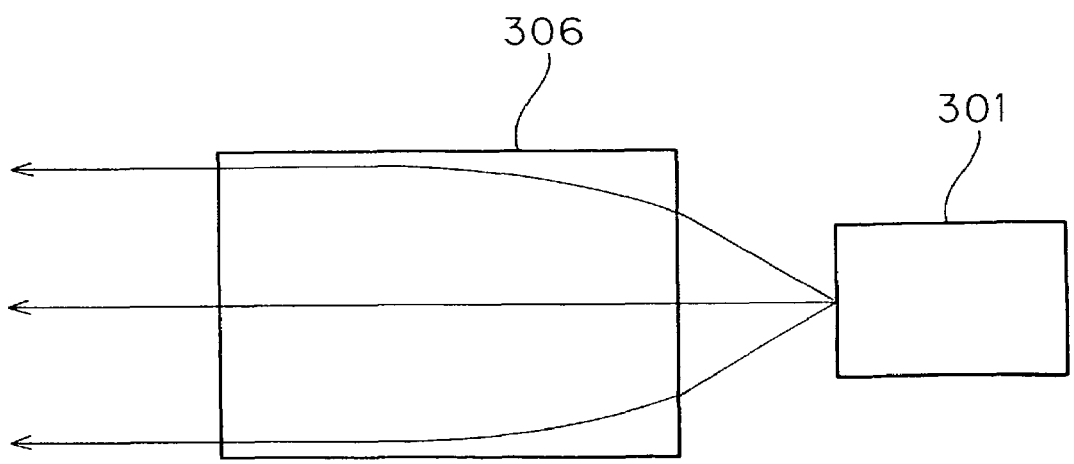
FIG. 5 illustrates laser beams emitted from a bare chip and collimated through a collimator lens.

FIG. 5 illustrates the laser beams emitted from the bare chip 301 and collimated by the collimator lens 306. The collimator lens 306 is formed by a refractive index profile lens having a refractive index not constant but varied from the center toward the periphery dissimilarly to a general lens. When the positional relation between such a collimator lens 306 and the bare chip 301 is fixed, the laser beams can be collimated as shown in FIG. 5. The collimator lens 306 may alternatively be formed by a small general lens or an aspherical lens suitable for collimation.

Figure 6:
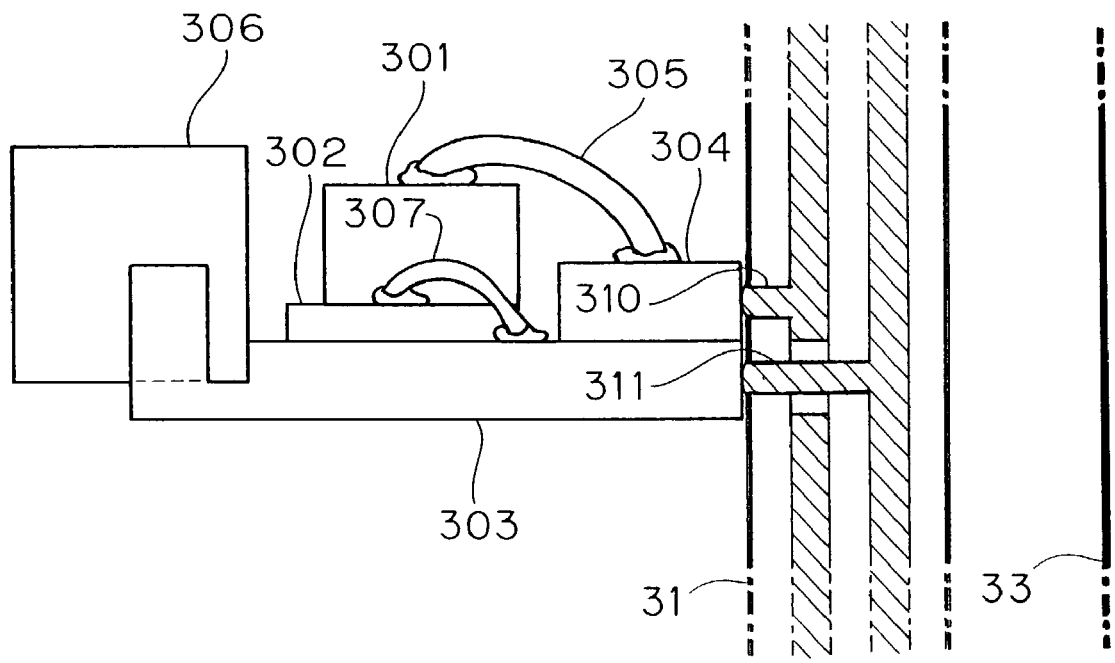
FIG. 6 illustrates the light source part connected to a fixable member in detail.

FIG. 6 illustrates the light source part 300 connected to the fixable member 31 in detail. As shown in FIG. 6, the submount 303 of the light source part 300 is directly fixed to the fixable member 31, whereby the degree of integration of the laser beams can be improved as compared with a conventional case of fixing can packaging light source elements to the fixable member 31 and integrating the same.

The fixable member 31, provided therein with a wire for supplying current to the bare chip 301 of the laser diode, has an anode 310 and a cathode 311. The current supply terminal 304 of the light source part 300 is connected to the anode 310, and the submount 303 (more particularly, the plated portion of the surface of the submount 303) is connected to the cathode 311.

Thus, the current for driving the bare chip 301 of the laser diode can be supplied.

Further, the fixable member 31 is prepared from a ceramic material such as aluminum nitride having excellent thermal conductivity, to be capable of efficiently transmitting heat generated in the bare chip 301 to the cooling unit 33 through the submount 303 for radiating the same (see FIG. 3). The cathode 311 is insulated from a wire connected with the anode 310.

In the image recorder 1 according to the first preferred embodiment, as hereinabove described, the structure of each light source part 300 forming the minimum unit emitting the laser beams is simplified in the optical unit of the optical recording head 20. The degree of integration of the laser beams can be improved as compared with the case of integrating can packaging light source elements as light source parts, due to direct fixation to a desired configurational position of the fixable member 31. Stability of optical output can be improved due to employment of no optical fiber member, while breakage probability in the manufacturing steps can be reduced and alignment accuracy can be improved by assembling the light source part 300 after fixing the bare chip 301 to the submount 302 having the function of a protective member.

The light source part 300 is positioned on the basis of the collimator lens 306 defining the emitting direction of the laser beams, whereby the positioning accuracy of the laser beams can be improved. Further, the fixable member 31 has the current supply function and the heat radiation or heat transmission function, whereby the structure can be simplified as compared with a case of separately providing these functions and the degree of integration of the laser beams can be improved.

While the aforementioned first preferred embodiment employs only the single fixable member 31 to and on which the plurality of light source parts 300 are fixed and arranged in the light source unit 30 of the image recorder 1, a plurality of fixable members may alternatively be arranged in a three-dimensional layout.

Figure 7:
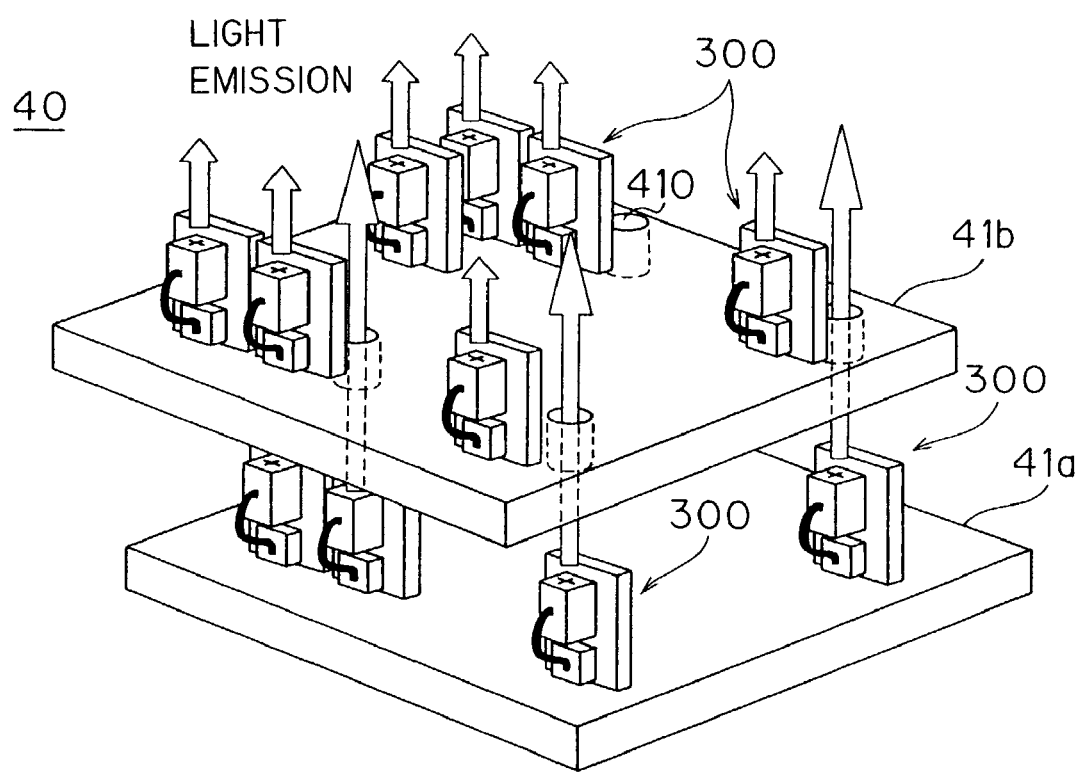
FIG. 7 illustrates the configurational relation between fixable members and light source parts of a light source unit according to a second preferred embodiment of the present invention.

FIG. 7 illustrates the configurational relation between fixable members 41a and 41b and light source parts 300 of a light source unit 40 according to a second preferred embodiment of the present invention formed according to such a principle. The light source unit 40 has the plurality of fixable members 41a and 41b. Referring to FIG. 7, structures similar to those of the first preferred embodiment are properly simplified.

The fixable members 41a and 41b are arranged in a three-dimensional layout as shown in FIG. 7, while the plurality of light source parts 300 are divided into a plurality of light source groups so that submounts 303 of the respective light source groups are fixed to the fixable members 41a and 41b in a directly arranged state. The fixable member 41b is provided with beam transmission holes 410 for transmitting laser beams, not to block the laser beams emitted from the light source parts 300 fixed to the fixable member 41a.

When the light source unit 40 according to the second preferred embodiment is applied to an image recorder, the degree of integration of the laser beams can be improved as compared with a case of integrating light source parts by a single fixable member due to employment of the plurality of fixable members 41a and 41b.

While all light source parts 300 arranged on the fixable members 31, or 41a and 41b have the same composition in the light source unit 30 or 40 according to each of the aforementioned first and second preferred embodiments, a light source unit may alternatively be formed by arranging a plurality of light source parts having different compositions.

Figure 8:
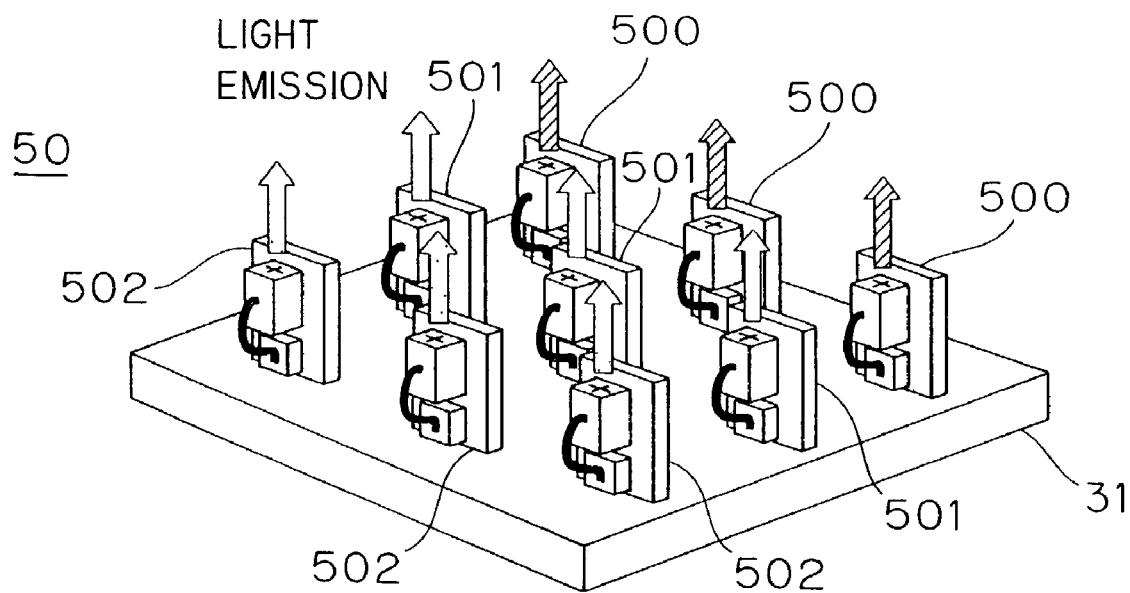
FIG. 8 illustrates the structures of a fixable member of a light source unit formed by light source parts employing different semiconductors and the light source parts according to a third preferred embodiment of the present invention.

FIG. 8 illustrates the structures of a fixable member 31 and light source parts 500 to 502 employing different semiconductors in a light source unit 50 according to a third preferred embodiment of the present invention. While each of the light source parts 500 to 502 is similar in structure to the light source part 300 (see FIG. 4) according to the first preferred embodiment, the light source parts 500, 501 and 502 having bare chips of GaAs-based red laser diodes, ZnSe-based green laser diodes and GaN-based blue laser diodes respectively emit laser beams having different wavelengths respectively due to the different materials.

According to the aforementioned composition, an image recorder employing the light source unit 50 according to the third preferred embodiment of the present invention attains effects similar to those of the aforementioned first and second embodiments, and can record color images due to the laser diodes emitting laser beams having different wavelengths in correspondence to red, green and blue respectively. Also in the third preferred embodiment, a plurality of fixable members may be employed for further improving the degree of integration of the laser beams, similarly to the second preferred embodiment. This also applies to the following fourth and fifth preferred embodiments of the present invention.

While the flat positioning member 32 is employed in the aforementioned first preferred embodiment, the positioning member may alternatively be in the form of a spherical shell.

Figure 9:
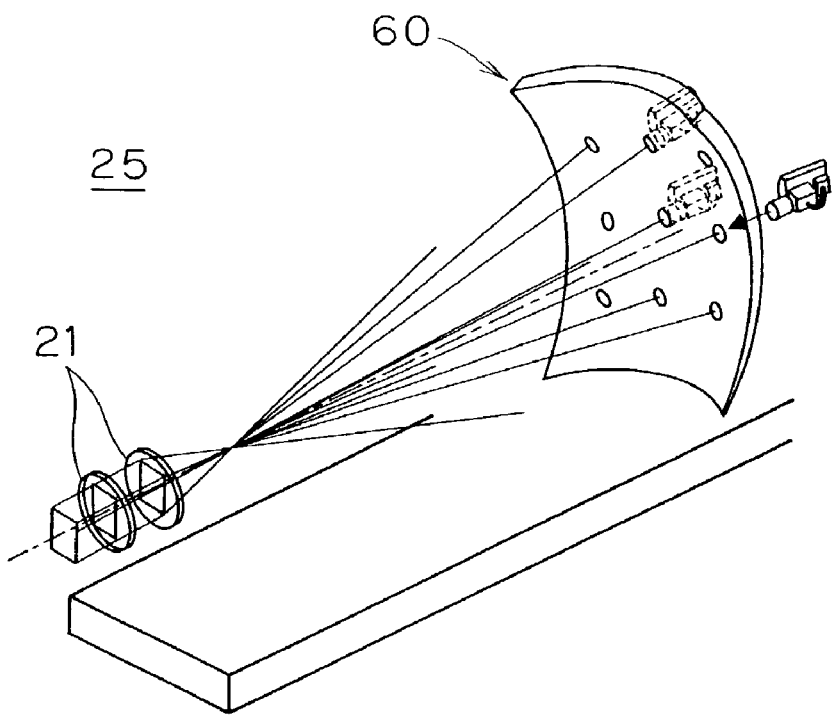
FIG. 9 illustrates the structure of an optical system of an optical recording head according to a fourth preferred embodiment of the present invention.

FIG. 9 illustrates the structure of an optical system of an optical recording head 25 according to the fourth preferred embodiment of the present invention formed according to such a principle. The optical system of the optical recording head 25 is formed by an optical unit 60 and zoom lenses 21.

Figure 10:
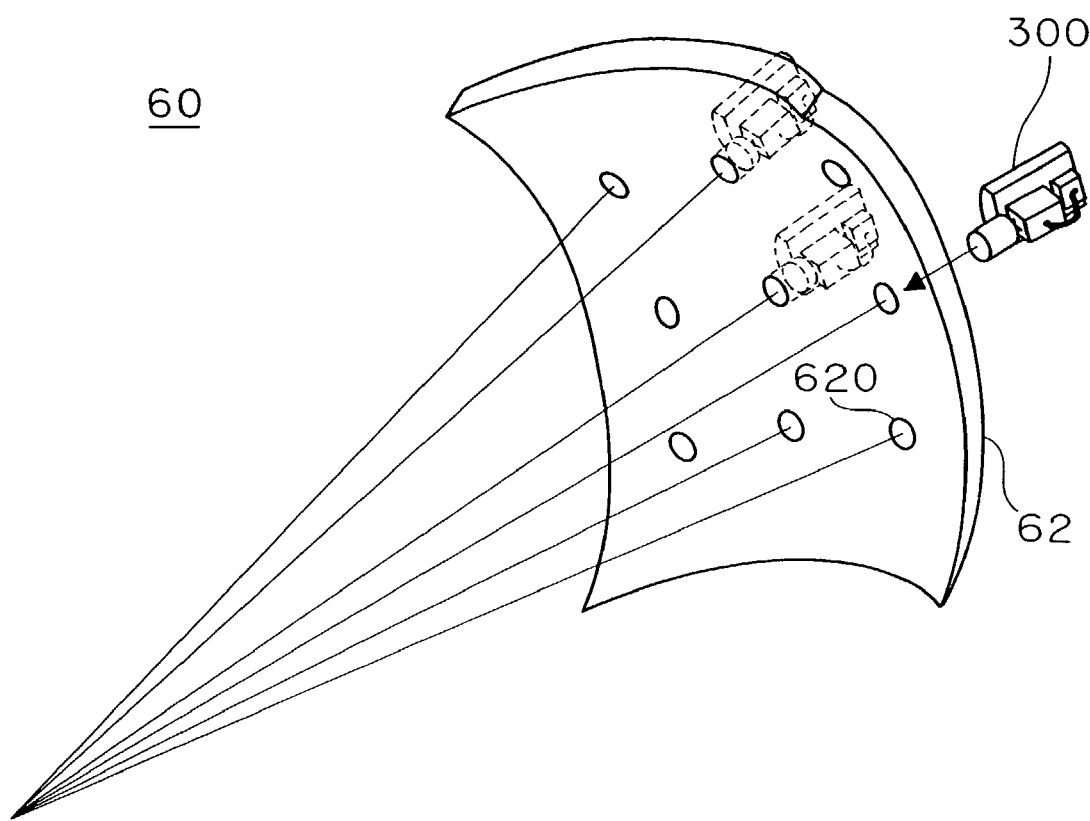
FIG. 10 illustrates the structure of an optical unit according to the fourth preferred embodiment of the present invention.
Figure 1:
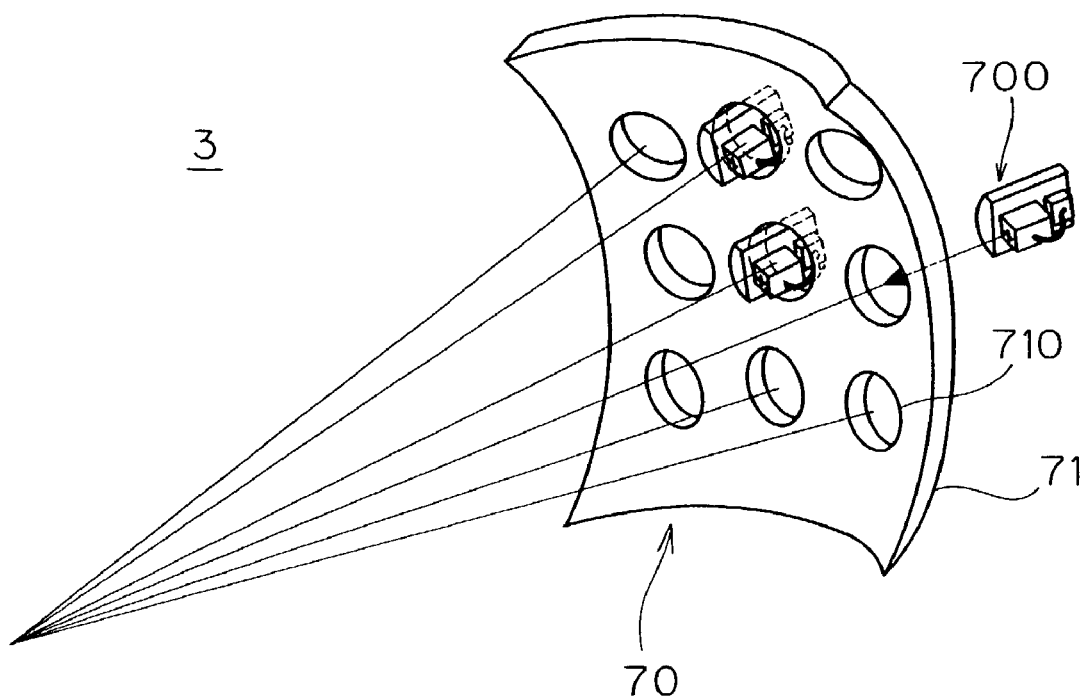
Figure 1:
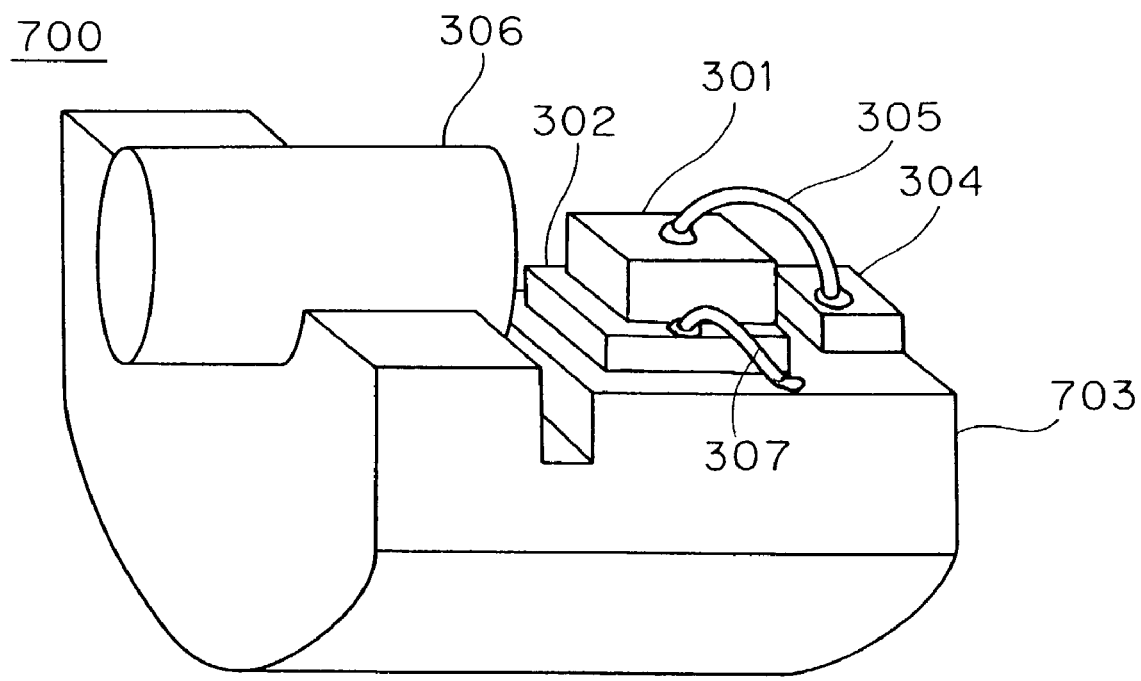

FIG. 10 illustrates the structure of the optical unit 60 according to this preferred embodiment. The optical unit 60 has a positioning member 62 in the form of a spherical shell, while lens holes 620, provided on prescribed positions of the positioning member 62 for concentrating laser beams emitted from light source parts 300 to the center of the spherical shell, receive collimator lenses 306 fit therein respectively thereby positioning the light source parts 300, similarly to the positioning member 32 according to the first preferred embodiment.

According to the aforementioned structure, the optical recording head 25 according to the fourth preferred embodiment can also attain effects similar to those of the aforementioned first to third embodiments. The positioning member 62 is provided in the form of a spherical shell so that the laser beams emitted from the light source parts 300 can be concentrated to the center of the spherical shell and the optical recording head 25 may not be separately provided with a structure, such as the field lens 22 shown in FIG. 2, for concentrating the laser beams. Also in the fourth preferred embodiment, light source parts emitting laser beams of different wavelengths may be employed so that an image recorder can perform color recording, similarly to the third preferred embodiment. This also applies to the following fifth preferred embodiment.

While the positioning member 62 is provided in the form of a spherical shell for concentrating the laser beams to the center of the spherical shell in the aforementioned fourth preferred embodiment, a fixable member can also be provided in the form of a spherical shell. Further, the submount for each light source part can also be shaped to be capable of positioning and fixing the light source part on and to a desired position of the fixable member.

FIG. 11 illustrates the relation between a fixable member 71 and light source parts 700 in a light source unit 70 according to the fifth preferred embodiment of the present invention formed according to such a principle. The light source unit 70 is formed by the fixable member 71 and the plurality of light source parts 700. The fixable member 71 is provided with a plurality of fixing holes 710 for fixedly receiving the light source parts 700 respectively, so that the light source parts 700 are fit into the fixing holes 710 respectively to be directly fixed to and arranged on the fixable member 71.

The fixable member 71 is provided in the form of a spherical shell as shown in FIG. 11, and the fixing holes 710 are provided on prescribed positions for concentrating laser beams emitted from the fixed light source parts 700 to the center of the spherical shell. In other words, each fixing hole 710 has a function of positioning and fixing a submount 703 on and to a prescribed position of the fixable member 71.

FIG. 12 illustrates the appearance of each light source part 700 according to the fifth preferred embodiment. While the structure of the light source part 700 is substantially similar to that of the light source part 300 (see FIG. 4), the former is different from the latter in a point that the submount 703 has a lower portion semicylindrically formed in response to the shape of each fixing hole 710 of the fixable member 71, as shown in FIG. 12. The shape of the submount 703 is such that the position of the submount 703 is determined on the desired position on the surface of the fixable member 71 and the submount 703 is fixed to the desired position.

According to the aforementioned structure, effects similar to those of the aforementioned first to fourth embodiments can be attained also when applying the light source unit 70 according to the fifth preferred embodiment of the present invention to an optical recording head 25. Further, the laser beams emitted from the light source parts 700 can be concentrated to the center of the spherical shell, so that no structure for concentrating the laser beams may be separately provided when applying the light source unit 70 to the optical recording head 25. In addition, the submount 703 is provided in the form suitably receivable in each fixing hole 710 provided on the fixable member 71, whereby each light source part 700 can be fixed to the fixable member 71 with excellent positioning accuracy. Also in the fifth preferred embodiment, a positioning member may be provided in the form of a spherical shell, similarly to the fourth preferred embodiment.

The fixable member 41b according to the second preferred embodiment of the present invention may alternatively have a function of positioning the light source parts 300 fixed to the fixable member 41a, similarly to the positioning member 32. In this case, the beam transmission holes 410 provided for transmitting the laser beams have a function of receiving the collimator lenses 306 of the light source parts 300 fixed to the fixable member 41a, similarly to the lens holes 320.

While the invention has been shown and described in detail, the foregoing description is in all aspects illustrative and not restrictive. It is therefore understood that numerous modifications and variations can be devised without departing from the scope of the invention.

What is claimed is:

1. An image recorder for recording an image on a recording medium, comprising:
   a) a light source unit emitting a plurality of laser beams, said light source unit comprising
      a-1) a plurality of light source parts, said plurality of light source parts each comprising:
         a-1-1) a bare chip of a laser diode emitting laser beam;
         a-1-2) a submount holding said bare chip of said laser diode thereon; and
      a-2) a fixing part, said fixing part comprising
         a-2-1) at least one fixed element to which said submounts are directly fixed; and
   b) a scanning mechanism scanning said recording medium using said plurality of laser beams, wherein said plurality of light source parts are fixed to said at least one fixed element at surfaces to establish a direct electrical connection between said plurality of light source parts and said at least one fixed element, and each of said surfaces being substantially perpendicular to an emitting direction of said laser beams.

2. The image recorder according to claim 1, wherein said plurality of light source parts are fixed to said at least one fixed element such that both an anode electrode and a cathode electrode of each of said plurality of light source parts are electrically connected to said at least one fixed element.

3. A light source unit comprising:
   a) a plurality of light source parts, said plurality of light source parts each comprising:
      a-1) a bare chip of a laser diode emitting laser beam;
      a-2) a submount holding said bare chip of said laser diode thereon; and
   b) a fixing part, said fixing part comprising:
      b-1) at least one fixed element to which said submounts are directly fixed,
   wherein
   said plurality of light source parts are fixed to said at least one fixed element at surfaces to establish a direct electrical connection between said plurality of light source parts and said at least one fixed element, and each of said surfaces being substantially perpendicular to an emitting direction of said laser beams.

4. The light source unit according to claim 3, wherein said fixing part comprises a plurality of fixed elements, and said plurality of fixed elements are arranged in a three-dimensional layout.

5. The light source unit according to claim 3, wherein said fixing part comprises said fixed element in the form of a spherical shell.

6. The light source unit according to claim 3, wherein said fixed element comprises:
   b-1-1) a wire for supplying current to said bare chip of said laser diode of each one of said plurality of light source parts.

7. The light source unit according to claim 3, wherein said fixed element includes a radiator or a heat conductor.

8. The light source unit according to claim 3, wherein a shape of said submount is such that a position of said submount is determined on a desired position on a surface of said fixed element and said submount is fixed to said desired position.

9. The light source unit according to claim 3, wherein said submount comprises:
   a-2-1) a first block for holding said bare chip of said laser diode, and
   a-2-2) a second block for holding said first block thereon and directly fixed to said fixed element.

10. The light source unit according to claim 3, wherein said plurality of light source parts each further comprise:
    a-3) a terminal for supplying driving current to said bare chip of said laser diode.

11. The light source unit according to claim 3, wherein said plurality of light source parts emit laser beams having different wavelengths.

12. The light source unit according to claim 3, wherein said plurality of light source parts each further comprise:
    a-4) an optical element for collimating said laser beam emitted from said bare chip of said laser diode, and
    said light source unit further comprises:
    c) a positioning element for defining arrangement of said plurality of light source parts on the basis of said optical element.

13. The light source unit according to claim 12, wherein said positioning element is in the form of a spherical shell.

14. The light source unit according to claim 3, wherein said plurality of light source parts are fixed to said at least one fixed element such that both an anode electrode and a cathode electrode of each of said plurality of light source parts are electrically connected to said at least one fixed element.

* * * * *